United States Patent
Ozluturk et al.

(10) Patent No.: US 6,434,135 B1
(45) Date of Patent: Aug. 13, 2002

(54) ADAPTIVE RF AMPLIFIER PRELIMITER

(75) Inventors: Fatih M. Ozluturk, Port Washington, NY (US); Brian Kiernan, Voorhees, NJ (US)

(73) Assignee: Interdigital Technology Corporation, Wilmington, DE (US)

( * ) Notice: Subject to any disclaimer, the term of this patent is extended or adjusted under 35 U.S.C. 154(b) by 0 days.

(21) Appl. No.: 09/386,876

(22) Filed: Aug. 31, 1999

(51) Int. Cl.⁷ .............................................. H04B 7/214
(52) U.S. Cl. ....................... 370/342; 370/318; 375/295; 375/296; 375/297; 375/298; 375/299; 375/300; 375/301; 375/302; 375/303; 375/304; 375/305; 375/306; 375/307; 375/308; 375/309; 375/310; 375/311; 375/312; 375/313; 375/314; 375/315; 455/522
(58) Field of Search .................... 375/130; 370/335, 370/342, 332; 455/522

(56) References Cited

U.S. PATENT DOCUMENTS

| | | | | |
|---|---|---|---|---|
| 5,300,894 A | * | 4/1994 | Myer et al. .................. | 330/129 |
| 5,396,516 A | * | 3/1995 | Padovani et al. ........... | 375/225 |
| 5,457,811 A | * | 10/1995 | Lemson ...................... | 455/67.1 |
| 5,485,486 A | * | 1/1996 | Gilhousen et al. .......... | 375/205 |
| 5,535,238 A | * | 7/1996 | Schilling et al. ............ | 375/200 |
| 5,870,393 A | * | 2/1999 | Yano et al. .................. | 370/335 |
| 5,991,262 A | * | 11/1999 | Laird et al. ................. | 370/209 |
| 6,094,585 A | * | 7/2000 | Dajer et al. ................. | 455/522 |
| 6,144,860 A | * | 11/2000 | Komatsu ..................... | 455/522 |
| 6,175,586 B1 | * | 1/2001 | Lomp ......................... | 375/130 |
| 6,301,485 B1 | * | 10/2001 | Lee ............................. | 455/522 |

FOREIGN PATENT DOCUMENTS

| | | |
|---|---|---|
| EP | 0751630 A2 | 1/1997 |
| WO | WO9918686 | 4/1999 |

OTHER PUBLICATIONS

Fatih M. Ozluturk and Gary Lomp, "Effect of Limiting the Downlink Power in CDMA Systems with or without Forward Power Control", InterDigital Communications Corporation, (1995).
Fatih M. Ozluturk, Ariela Zeira and Steve Dick, "Effect of Baseband Limiting on Signal to Noise Ratio", InterDigital Communications Corporation.

* cited by examiner

Primary Examiner—Daniel Hunter
Assistant Examiner—Stephen D'Agosta
(74) Attorney, Agent, or Firm—Volpe and Koenig, PC

(57) ABSTRACT

The invention reduces transient peaks in signals transmitted in CDMA communication systems. A plurality of spread spectrum data signals are combined into a combined signal having fluctuating power level corresponding to the combination of the data signals. The combined signal is modulated to produce an RF signal for transmission. The average power of the combined signal is measured over a selected time period. The combined signal power level is adaptively limited to a calculated power level based at least in part on the measured power.

18 Claims, 9 Drawing Sheets

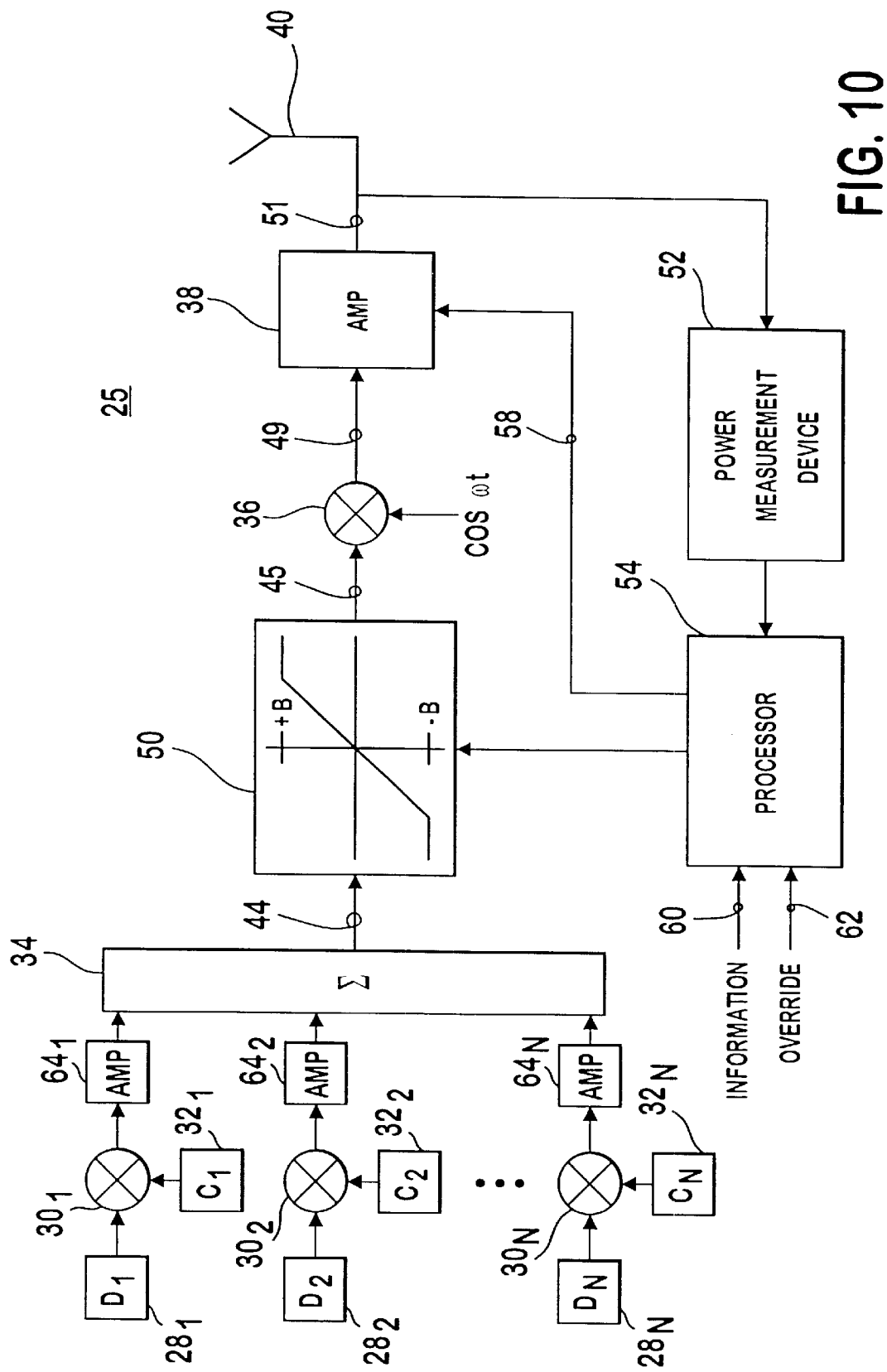

ADAPTIVE RF AMPLIFIER PRELIMITER

BACKGROUND OF THE INVENTION

1. Field of the Invention

This invention generally relates to spread spectrum code division multiple access (CDMA) communication systems. More particularly, the present invention relates to a system and method for adaptively limiting forward and reverse link transmission power within CDMA communication systems.

2. Description of the Prior Art

Wireless communication systems using spread spectrum modulation techniques represent the state of the art in digital communications and are increasing in popularity. In code division multiple access (CDMA) systems, data is transmitted using a wide bandwidth (spread spectrum) by modulating the data with a pseudo random chip code sequence. The advantage gained is that CDMA systems are more resistant to signal distortion and interfering frequencies in the transmission channel than communication systems using other multiple access techniques such as time division multiple access (TDMA) or frequency division multiple access (FDMA).

One indicator used to measure the performance of a communication system is the signal-to-noise ratio (SNR). At the receiver, the magnitude of the desired received signal is compared to the magnitude of the received noise. The data within a transmitted signal received with a high SNR is readily recovered at the receiver. A low SNR leads to loss of data.

A prior art CDMA communication system is shown in FIG. 1. The communication system has a plurality of base stations $20_1, 20_2 \ldots 20_N$ connected together through a local Public Switched Telephone Network (PSTN) exchange. Each base station $20_1, 20_2 \ldots 20_N$ communicates using spread spectrum CDMA with mobile and fixed subscriber units $22_1, 22_2 \ldots 22_N$ within its cellular area.

Shown in FIG. 2 is a simplified CDMA transmitter 24 and receiver 26. A data signal having a given bandwidth is mixed with a spreading code generated by a pseudo random chip code sequence generator producing a digital spread spectrum signal for transmission. Upon reception, the data is reproduced after correlation with the same pseudo random chip code sequence used to transmit the data. By using different pseudo random chip code sequences, many data signals or subchannels can share the same channel bandwidth. In particular, a base station 20, can communicate with a group of subscriber units $22_1, 22_2 \ldots 22_N$ using the same bandwidth. Forward link communications are from the base station $20_1$ to the subscriber unit $22_1, 22_2 \ldots 22_N$, and reverse link communications are from the subscriber unit $22_1, 22_2 \ldots 22_N$ to the base station $20_1$.

For timing synchronization with a receiver 26, an unmodulated pilot signal is used. The pilot signal allows respective receivers 26 to synchronize with a given transmitter 24, allowing despreading of a traffic signal at the receiver 26. In a typical CDMA system, each base station $20_1, 20_2 \ldots 20_N$ sends a unique global pilot signal received by all subscriber units $22_1, 22_2 \ldots 22_N$ within communicating range to synchronize forward link transmissions. Conversely, in some CDMA systems for example in the B-CDMA™ air interface each subscriber unit $22_1, 22_2 \ldots 22_N$ transmits a unique assigned pilot signal to synchronize reverse link transmissions.

FIG. 3 is an example of a prior art transmitter 24. Data signals $28_1, 28_2 \ldots 28_N$ including traffic, pilot and maintenance signals are spread using respective mixers $30_1, 30_2 \ldots 30_N$ with unique chip code sequences $32_1, 32_2 \ldots 32_N$, respectively. Each mixers' output is coupled to a combiner 34 which adds the individual mixed signals as a combined signal 44. The combined signal 44 is modulated up to radio frequency (RF) by a mixer 36 mixing the combined signal 44 with an RF carrier, shown in FIG. 3 as COS ωt. The modulated signal is amplified to a predetermined transmission power level (TLP) by an amplifier 38 and radiated by an antenna 40.

Most CDMA systems use some form of adaptive power control. In a CDMA system, many signals share the same bandwidth. When a subscriber unit $22_1, 22_2 \ldots 22_N$ or base station $20_1, 20_2 \ldots 20_N$ is receiving a specific signal, all the other signals within the same bandwidth are noise like in relation to the specific signal. Increasing the power level of one signal degrades all other signals within the same bandwidth. However, reducing TLP too far results in undesirable SNRs at the receivers 26. To maintain a desired SNR at the minimum transmission power level, adaptive power control is used.

Typically, a transmitter 24 will send a signal to a particular receiver 26. Upon reception, the SNR is determined. The determined SNR is compared to a desired SNR. Based on the comparison, a signal is sent in the reverse link to the transmitter 24, either increasing or decreasing transmit power. This is known as forward channel power control. Conversely, power control from the subscriber unit 22, to the base station 20, is known as reverse channel power control.

Amplifiers $64_1, 64_2 \ldots 64_n$ are used for adaptive power control in FIG. 3. The amplifiers $64_1, 64_2 \ldots 64_n$ are coupled to the inputs of the combiner 34 to individually control each signal's power level.

FIG. 4a, 4b, 4c and 4d show a simplified illustration of three spread spectrum signals $42_1, 42_2, 42_3$ and a resultant combined signal 44. Although each signal $42_1, 42_2, 42_3$ is spread with a different pseudo random chip code sequence, each signal $42_1, 42_2, 42_3$ is synchronous at the chipping rate. When the individual chips within the sequences are summed, the combined signal may have extreme transients 46, 48 where the chip energies combine or low transients 47 where they subtract.

High transient peaks are undesirable. For every 3 dB peak increase, twice the base amplification power in Watts is required. Not only does the transient burden the amplifier, but the power sourcing the amplifier must have a capacity greater than the maximum transient that may be expected. This is particularly undesirable in hand-held battery operated devices. Additionally, to design for higher power levels resulting from high transients, more complex amplifier circuitry is required or compromises between amplifier gain, battery life and communication time result. High valued transients force the amplifier 38 into the nonlinear region of its dynamic range resulting in increased out-of-band emissions and reduced amplifier efficiency. Accordingly, there exists a need for an adaptive RF transmitter system that addresses the problems associated with the prior art.

SUMMARY OF THE INVENTION

The invention reduces transient peaks in signals transmitted in CDMA communication systems. A plurality of spread spectrum data signals are combined into a combined signal having fluctuating power level corresponding to the combination of the data signals. The combined signal is modulated to produce an RF signal for transmission. The average power of the combined signal is measured over a selected time period. The combined signal power level is adaptively limited to a calculated power level based at least in part on the measured power.

BRIEF DESCRIPTION OF THE DRAWINGS

FIG. 10 is a system block diagram of an alternate embodiment of the invention with the processor controlling the amplifier gain.

DESCRIPTION OF THE PREFERRED EMBODIMENTS

Figure 1:
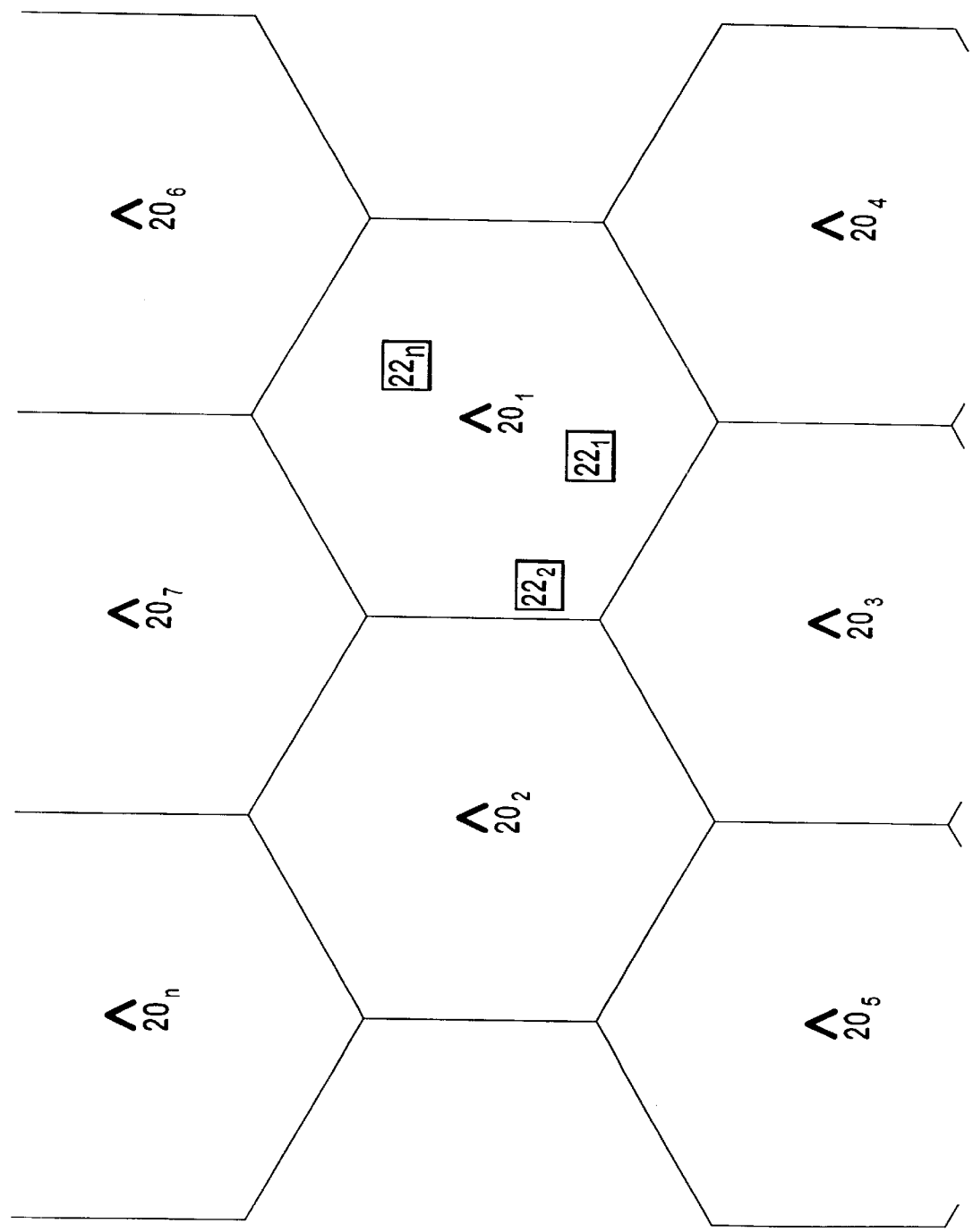
FIG. 1 is an illustration of a prior art CDMA system.
Figure 2:
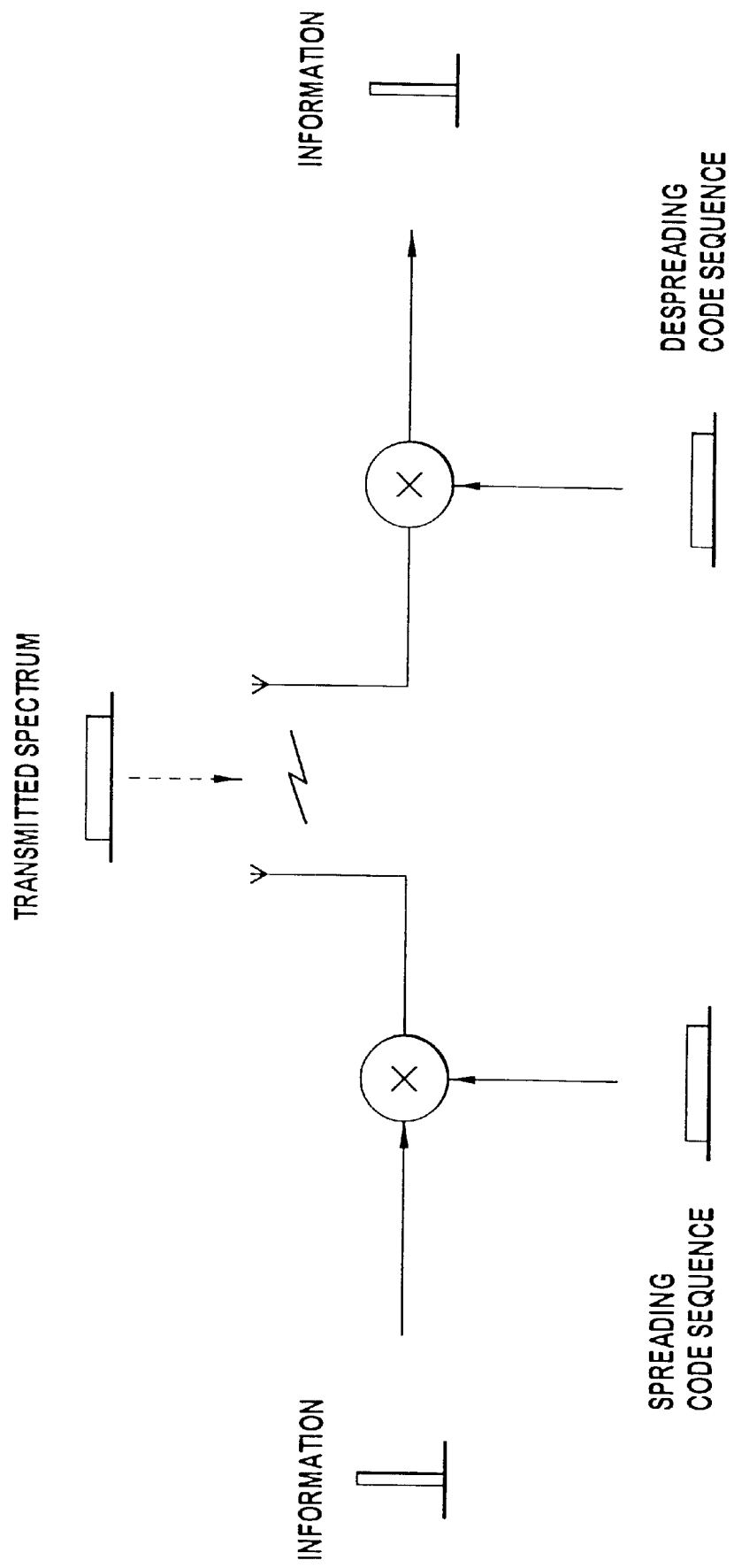
FIG. 2 is an illustration of a prior art CDMA transmitter and receiver.
Figure 3:
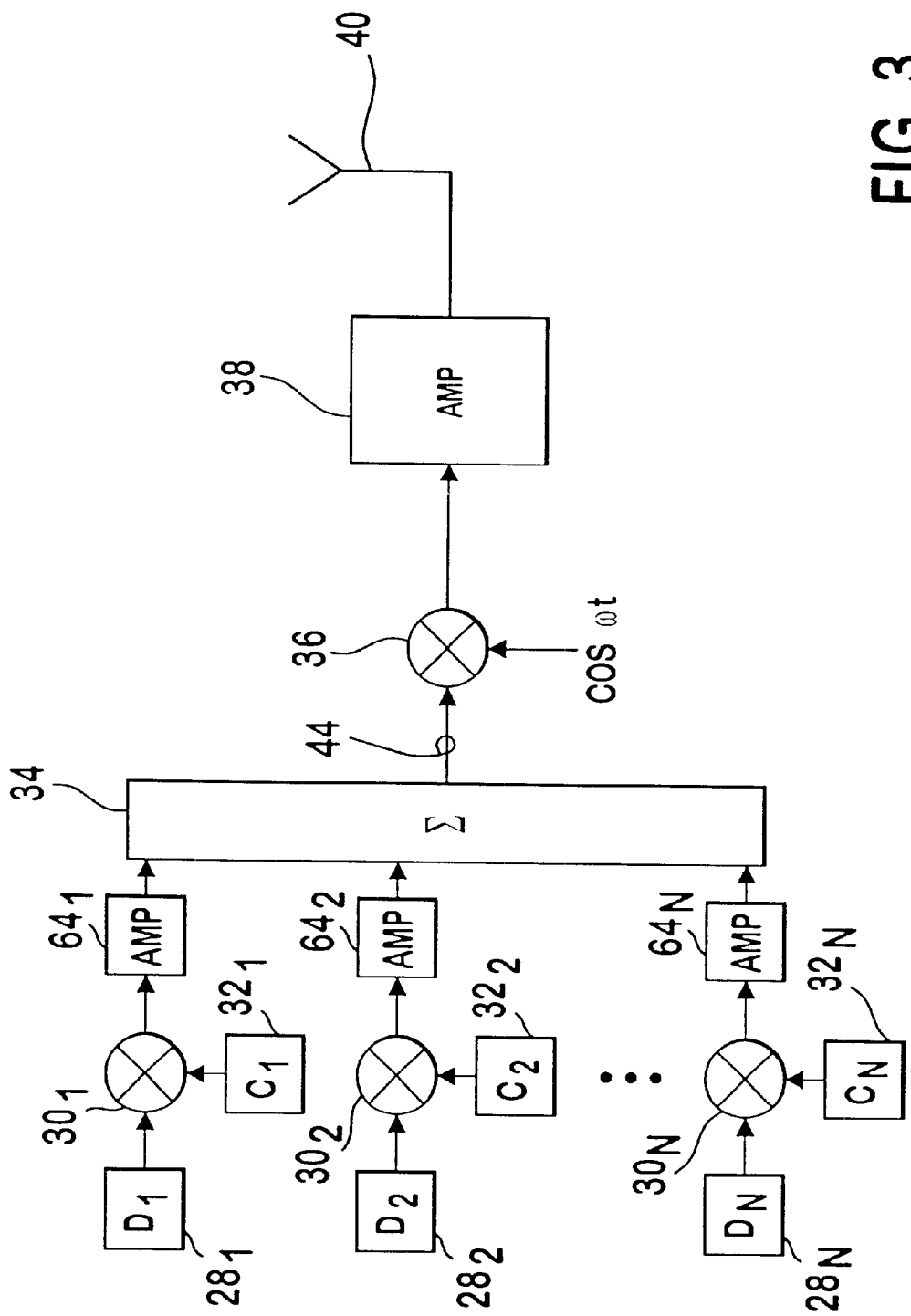
FIG. 3 is a system block diagram of a prior art transmitter.

The preferred embodiments will be described with reference to the drawing figures where like numerals represent like elements throughout.

Figure 5:
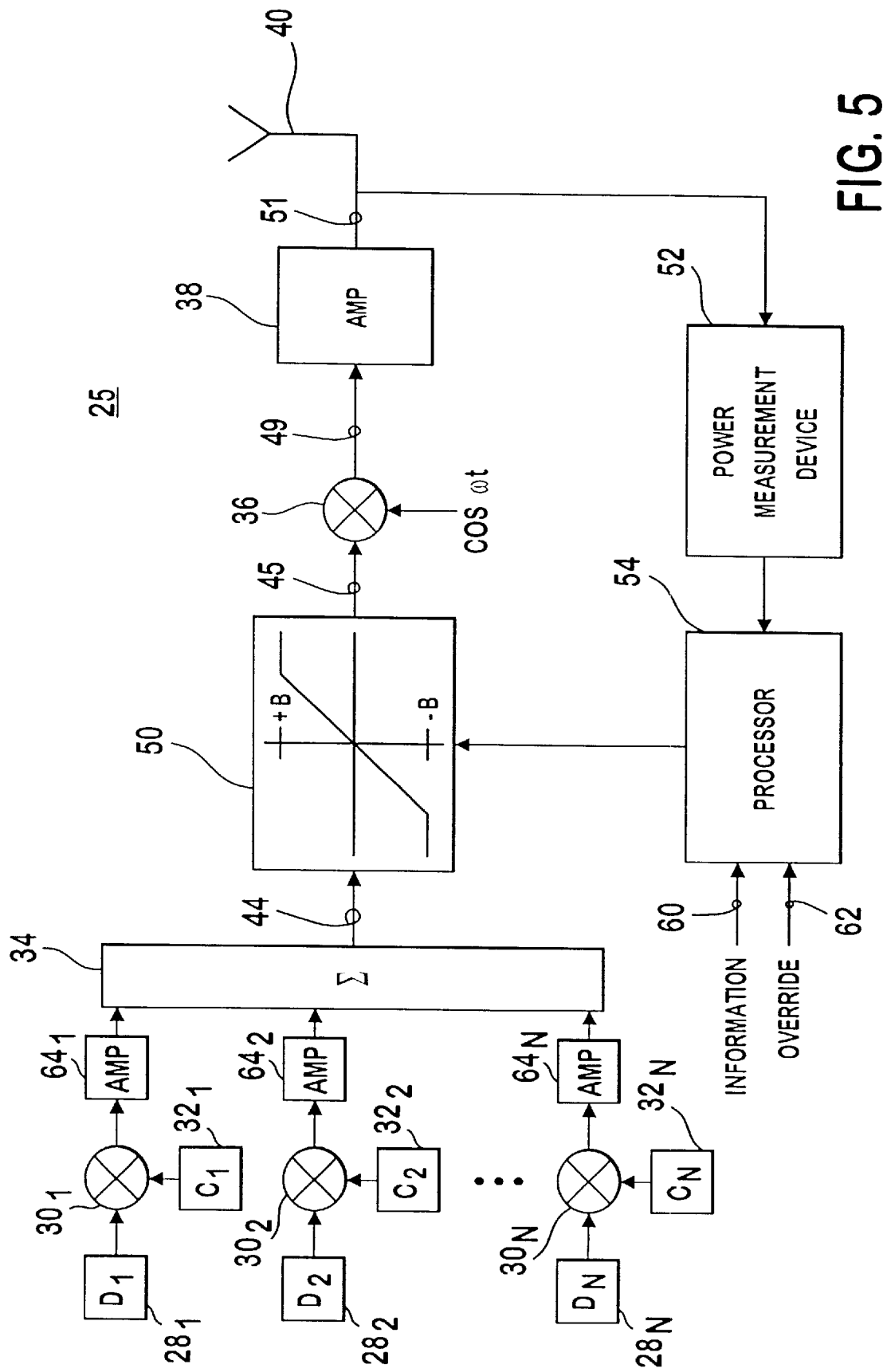
FIG. 5 is a system block diagram of an embodiment of the invention with the power measurement device coupled to the amplifier.
Figure 6:
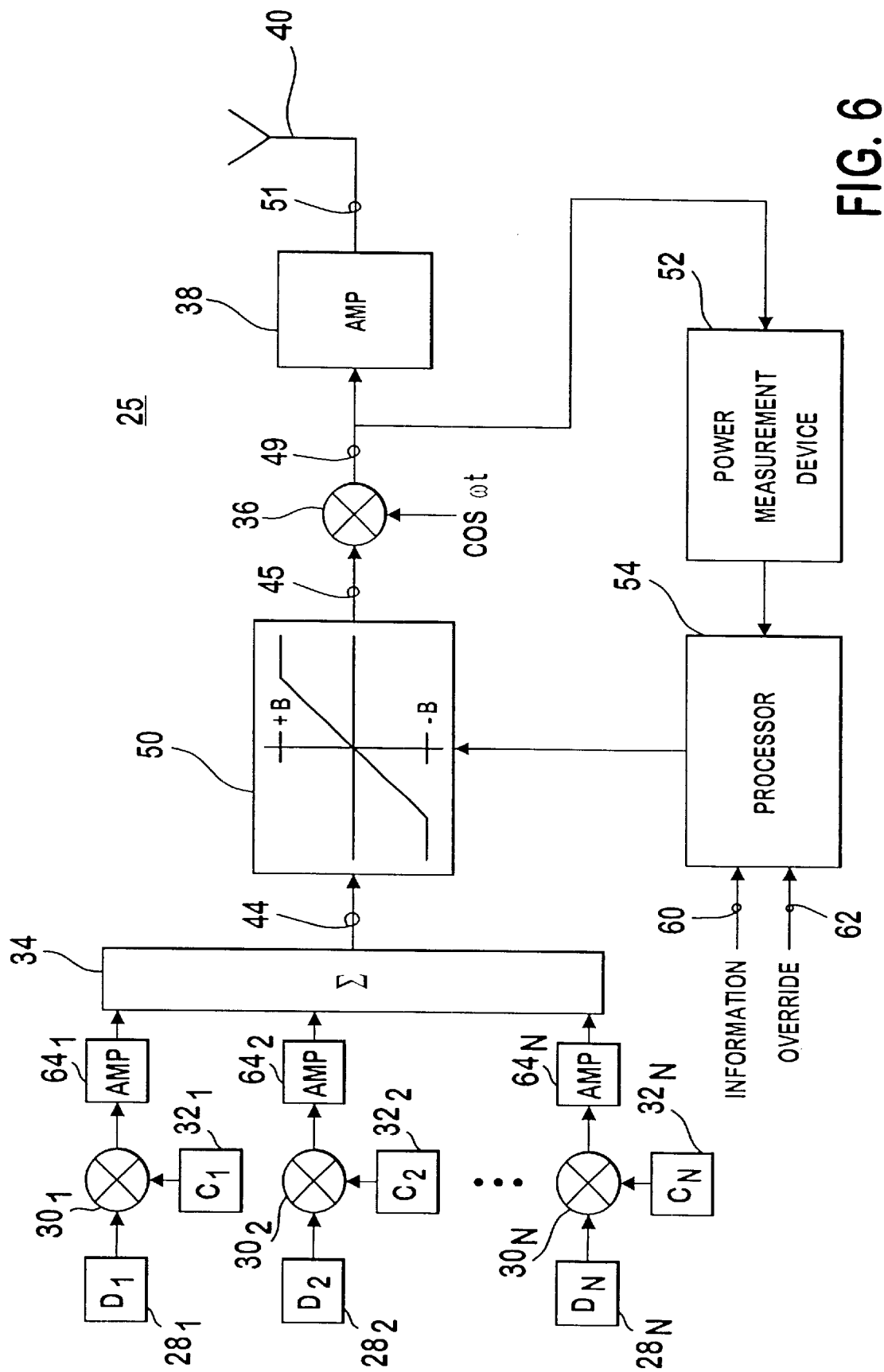
FIG. 6 is a system block diagram of an alternate embodiment of the invention with the power measurement device coupled to the modulator.

FIGS. 5 and 6 depict transmitter systems of the invention. A group of data signals $28_1$, $28_2$ . . . $28_N$ that include traffic, pilot and maintenance signals are mixed with different chip code sequences $32_1$, $32_2$ . . . $32_N$ and are summed together in a combiner 34 as a combined signal 44. The combiner 34 is coupled to an adjustable signal limiter 50 (clipper) where signal power levels are hard limited to $+\beta$ and $-\beta$ dB. Power levels in between $+\beta$ and $-\beta$ are not affected. The limited signal 45 is modulated up to RF by a mixer 36. The modulated signal is amplified by an amplifier 38 to a predetermined power level and radiated by antenna 40.

Figure 4:
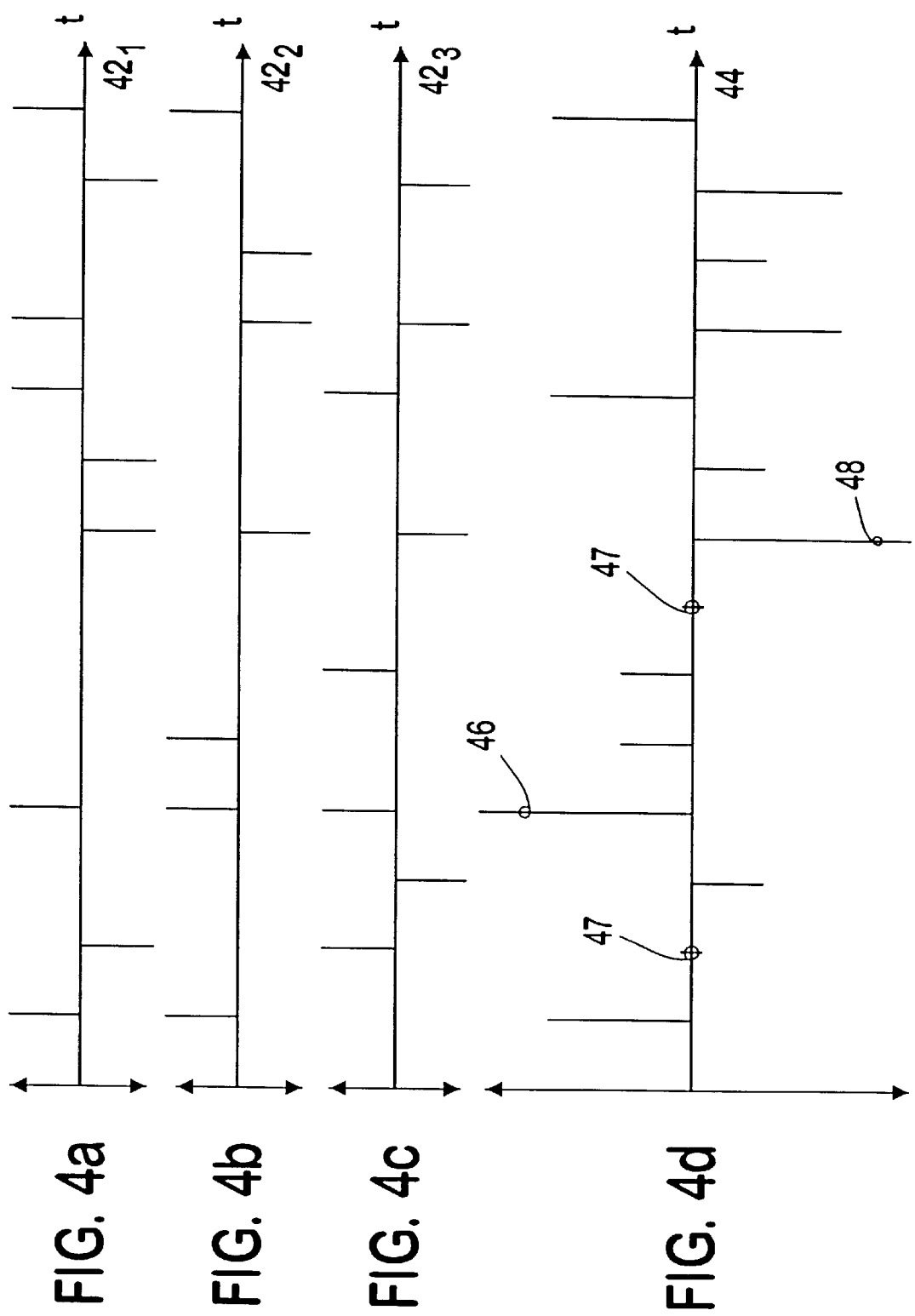
FIG. 4a is an illustration of a first pseudo random chip code sequence.
FIG. 4b is an illustration of a second pseudo random chip code sequence.
FIG. 4c is an illustration of a third pseudo random chip code sequence.
FIG. 4d is an illustration of the combined chip code sequences of FIGS. 4a–4c.
Figure 7:
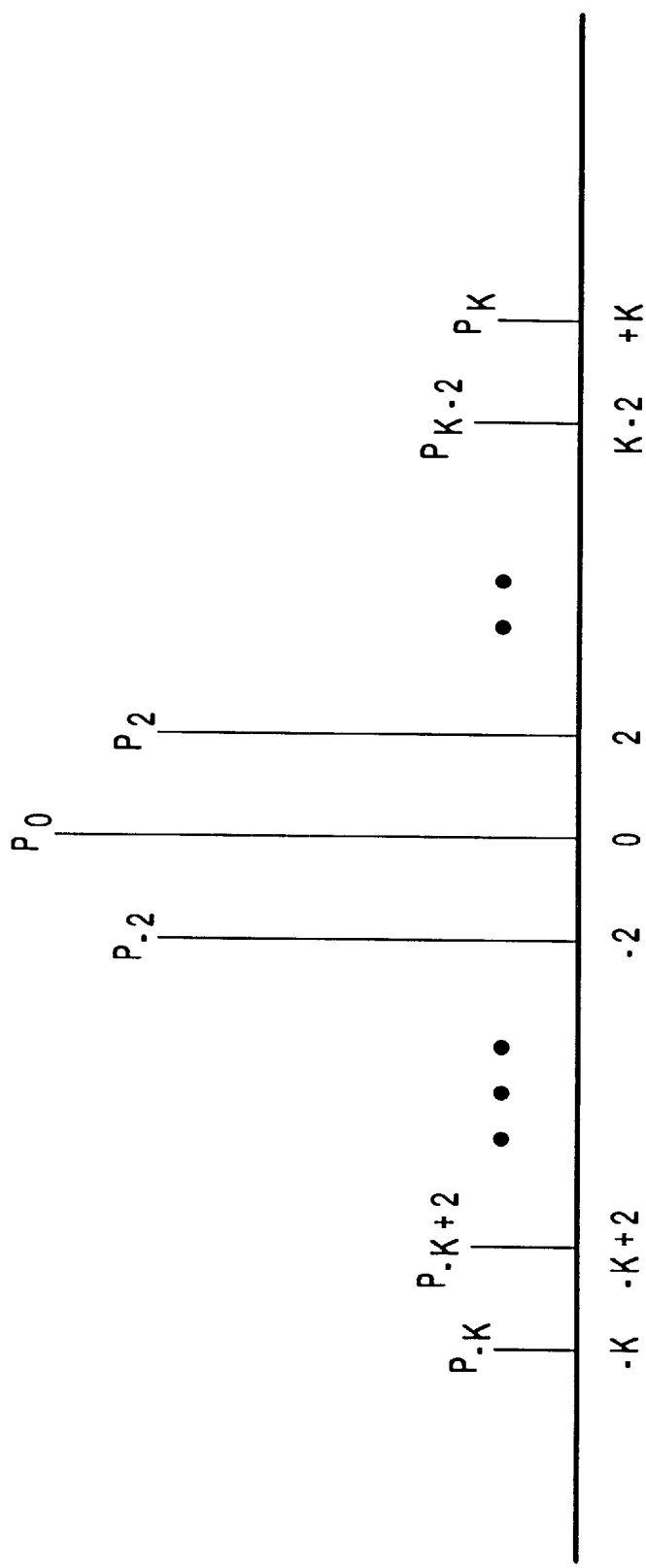
FIG. 7 is an illustration of the probability distribution function of the power levels of a combined signal.

FIG. 7 illustrates a typical probability distribution function of the combined signal power level. A combined chip 46, 47, 48 as shown in FIG. 4d will have an associated power level. The probability of a given combined chip having a particular power level is shown in FIG. 7. The two extreme power levels are +K and –K. As shown in FIG. 7, the probability of a given combined chip having a power level of +K or –K is extremely low. Whereas, the probability of a combined chip having a power level in the middle of the two extremes is high. Since a spread spectrum signal is spread across a wide communication bandwidth and there is a low probability that a combined chip will have a power level at the ends of the distribution, the combined signal 44 can be clipped below these extremes with insignificant loss.

Figure 8:
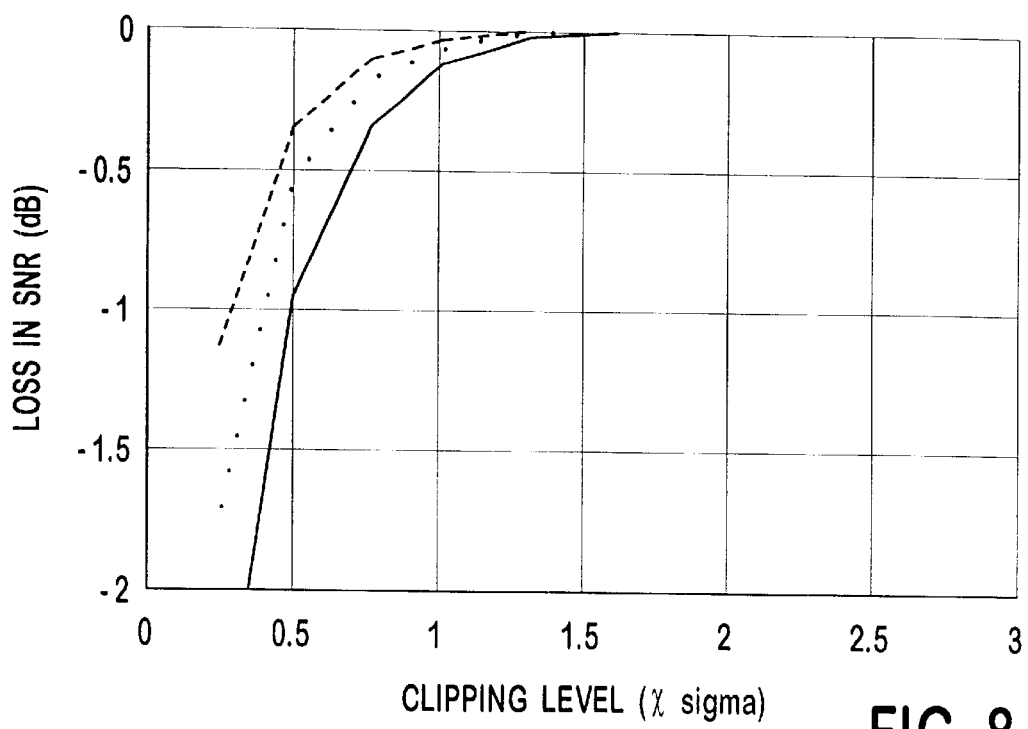
FIG. 8 is a plot of the loss in the received signal to noise ratio versus the clipping level.

The transmitter system adjusts the clipping levels, $\beta$, to eliminate the signal transients with only a small decrease in the transmittal signal-to-noise ratio (SNR). FIG. 8 is a graph illustrating the relationship between SNR and clipping levels for a system not using adaptive power control. The solid line, dash line and dotted line depict communication channels with different operating SNRs. As shown in FIG. 8, for a $\beta$ set at a clipping level of two standard deviations the loss in SNR is negligible and at a clipping level of one standard deviation the loss is only approximately 0.2 dB.

Figure 9:
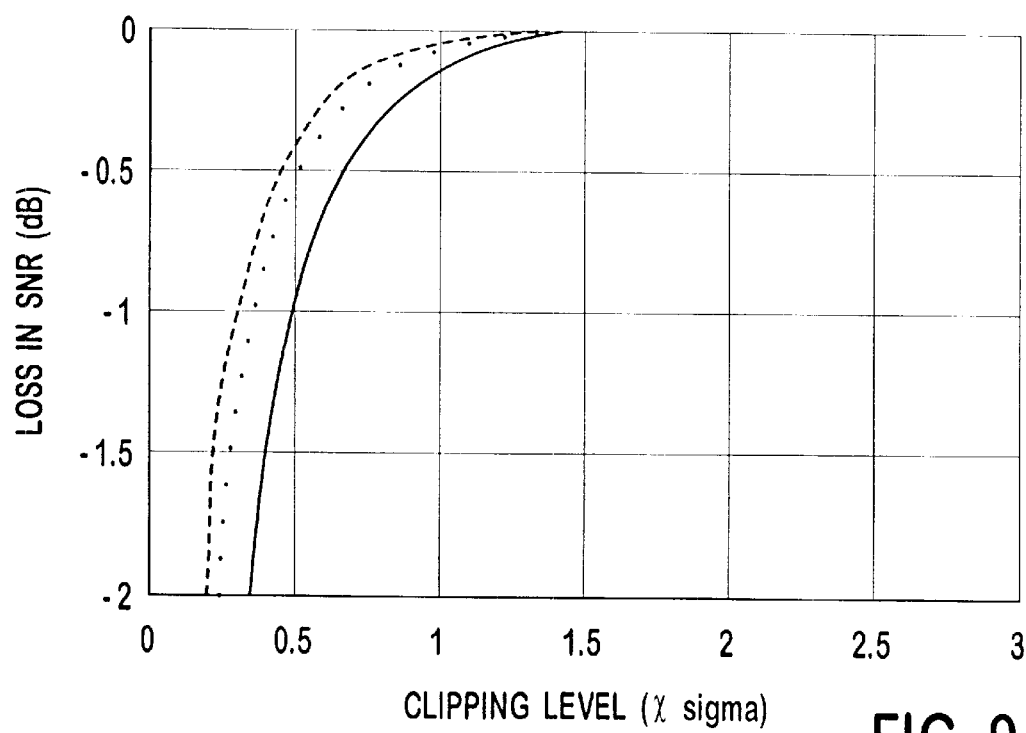
FIG. 9 is a plot of the loss in the received signal to noise ratio versus the clipping level in a CDMA communication system using adaptive power control.

For a system using adaptive power control, FIG. 9 is a graph of SNR versus the clipping level. The results are similar to those obtained in a system not using adaptive power control. As shown in FIG. 9, with a clipping level of two standard deviations, the loss in SNR is again negligible. Accordingly, the clipping circuitry is applicable to systems utilizing adaptive power control and systems not using adaptive power control.

Referring back to FIG. 5, to determine $\beta$, the invention uses a power measurement device 52 and a processor 54. The power measurement device 52 is coupled to either the output of the RF amplifier 38 as shown in FIG. 5 or the mixer 36 as shown in FIG. 6. Preferably, the power measurement device 52 determines the average of the square of the magnitude of the transmitted signal over a predetermined time period. The output of the preferred power measurement device 52 approximates the variance of the mixed signal 49 or the signal 51 being transmitted. Alternatively, the power measurement device 52 determines an approximation of the standard deviation by taking the average of the absolute value of the signal 49, 51 or the power measurement device 52 measures the magnitude of the signal 49, 51 with the processor determining either the variance or standard deviation.

The output of the power measurement device 52 is coupled to a processor 54. If the power measurement device 52 is coupled to the output of the amplifier 38, the processor 54 scales down the output of the power measurement device 52 by the gain of the amplifier 38.

The processor 54 determines the proper clipping level for $\beta$. Depending on the desired SNR and bandwidth, the value for $\beta$ will be a multiple of the standard deviation. If the power measurement device 52 approximates the variance, the processor 54 will take the square root of the device's output as the standard deviation. In the preferred embodiment, $\beta$ will be two times the standard deviation.

In certain situations, the processor 54 overrides the determined value of $\beta$. For instance, if the transmitter 25 was used in a base station $20_1$, $20_2$ . . . $20_N$, a large increase in the number of users may result in $\beta$ being temporarily set too low. This will result in an undesirable received SNR. As supplied to the processor 54 through the line 60, the number of users currently in communication with the base station $20_1$, $20_2$ . . . $20_N$, is used to either change $\beta$ or temporarily disable the clipper 50 to allow all signals to pass unaltered when appropriate.

Additionally, since the probability distribution function assumes a large sample size, a small number of users may result in an undesired received SNR. Accordingly, if only a few users were in communication with the base station $20_1$, $20_2$ . . . $20_N$, the clipper 50 may be disabled. In addition, when there are only a small number of users active, the amplifier's dynamic range is not reached. Accordingly, there is no need to clip the combined signal. Under other situations, it may be necessary to override the clipper 50. For instance, in some CDMA systems short codes are used during initial power ramp up. Since these codes are not long enough to approximate a random signal, by chance one code may result in a large number of high transient peaks within the signal. Clipping these transmissions may dramatically decrease the received SNR and unnecessarily delay the initial power ramp up procedure. In these situations, a signal will be sent to the processor 54 through the line 62 to override the clipper 50.

In an alternate embodiment shown in FIG. 10, the processor 54 is also used to control the gain of the amplifier 38 through the line 58. Stored in the processor is the amplifier gain characteristic. The amplifier gain is adjusted to keep the amplifier from going into the nonlinear operating region. Accordingly, out-of-band emissions and interference to services in adjoining frequency bands is reduced.

Although the invention has been described in part by making detailed reference to certain specific embodiments, such detail is intended to be instructive rather that restrictive. It will be appreciated by those skilled in the art that many variations may be made in the structure and mode of operation without departing from the scope of the invention as disclosed in the teachings herein.

What is claimed is:

1. A transmitter for use in a CDMA communication system station, the transmitter comprising:

means for combining a plurality of spread spectrum data signals into a combined signal having a fluctuating power level corresponding to the combination of the data signals;

means for modulating the combined signal to produce an RF signal for transmission;

means for measuring average power of the combined signal over a selected time period; and means for adaptively limiting the combined signal power to a calculated power level based at least in part on said measured power.

2. The transmitter of claim 1 wherein said measuring means measures an average power of the RF signal over the selected time period.

3. The transmitter of claim 1 further comprising an amplifier for amplifying the RF signal prior to transmission; wherein said measuring means measures an average power of the amplified RF signal over the selected time period.

4. The transmitter of claim 1 wherein the calculated power level is two of the determined standard deviations.

5. The transmitter of claim 1 wherein the calculated power level is the determined standard deviation.

6. The transmitter of claim 1 wherein said processing comprising means disables said adaptively limiting means in response to a number of active users.

7. The transmitter of claim 1 wherein said processing means disables said adaptively limiting means during transmission of short codes.

8. The transmitter of claim 1 further comprising an amplifier for amplifying the RF signal prior to transmission and processing means for determining the calculated power level; wherein a gain of said amplifier is adjusted by said processing means in response to the calculated power level and stored gain characteristics of said amplifier.

9. A method for transmission in a CDMA communication system, the method comprising:

combining a plurality of spread spectrum data signals into a combined signal having a fluctuating power level corresponding to the combination of the data signals;

modulating the combined signal to produce an RF signal;

measuring average power of the combined signal over a selected time period;

adaptively limited the combined signal power to a calculated power level based at least in part on said measured power; and transmitting the RF signal.

10. The method of claim 9 wherein the measuring is of an average power of the RF signal over a selected time period.

11. The method of claim 9 further comprising amplifying the RF signal prior to transmission; wherein the measuring is of an average power of the amplified RF signal over the selected time period.

12. The method of claim 9 wherein the calculated power is one of the standard deviations.

13. The method of claim 9 wherein the calculated power is two of the standard deviations.

14. The method of claim 9 wherein the step of adaptively limiting is not performed in response to a number of active users.

15. The method of claim 9 wherein the step of adaptively limiting is not performed in response a transmission of short codes.

16. The method of claim 9 further comprising:

amplifying by an amplifier the RF signal by a gain factor prior to transmission; and adjusting the gain factor in response to the calculated power level and stored gain characteristics of the amplifier.

17. A transmitter for use in a CDMA communication system station, the transmitter comprising:

means for combining a plurality of spread spectrum data signals into a combined signal having a fluctuating power level corresponding to the combination of the data signals;

means for modulating the combined signal to produce an RF signal for transmission;

means for measuring average power of the combined signal over a selected time period; and means for adaptively limiting the combined signal power to a calculated power level based at least in part on said measured power; and an amplifier for amplifying the RF signal prior to transmission and processing means for determining the calculated power level; wherein a gain of said amplifier is adjusted by said processing means in response to the calculated power level and stored gain characteristics of said amplifier.

18. A method for transmission in a CDMA communication system, the method comprising:

combining a plurality of spread spectrum data signals into a combined signal having a fluctuating power level corresponding to the combination of the data signals;

modulating the combined signal to produce an RF signal;

measuring average power of the combined signal over a selected time period;

adaptively limited the combined signal power to a calculated power level based at least in part on said measured power; and transmitting the RF signal; and adjusting the gain factor in response to the calculated power level and stored gain characteristics of the amplifier.

* * * * *

UNITED STATES PATENT AND TRADEMARK OFFICE
CERTIFICATE OF CORRECTION

PATENT NO. : 6,434,135 B1 Page 1 of 1
DATED : August 13, 2002
INVENTOR(S) : Ozluturk et al.

It is certified that error appears in the above-identified patent and that said Letters Patent is hereby corrected as shown below:

Column 1,
Line 47, delete "20," and insert therefor -- $20_1$ --.

Column 6,
Line 3, delete "limited" and insert therefor -- limiting --.
Line 14, delete "one of the standard deviations.", and insert therefor -- a standard deviation. --
Line 16, delete "of the".
Line 58, delete "limited" and insert therefor -- limiting --.

Signed and Sealed this

First Day of July, 2003

JAMES E. ROGAN
*Director of the United States Patent and Trademark Office*